(12) United States Patent
Uratsuji

(10) Patent No.: US 6,709,279 B2
(45) Date of Patent: Mar. 23, 2004

(54) CONTACT PIN MODULE AND TESTING DEVICE PROVIDED WITH THE SAME

(75) Inventor: Kazumi Uratsuji, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/026,756

(22) Filed: Dec. 27, 2001

(65) Prior Publication Data

US 2002/0086562 A1 Jul. 4, 2002

(30) Foreign Application Priority Data

Dec. 28, 2000 (JP) ........................................ 2000-403208

(51) Int. Cl.[7] .............................................. H01R 12/00
(52) U.S. Cl. ........................................... 439/71; 439/66
(58) Field of Search ............................... 439/71, 70, 72, 439/73, 330, 331, 66, 264, 266, 912, 591, 91; 324/754, 755

(56) References Cited

U.S. PATENT DOCUMENTS

| 3,631,380 | A | * | 12/1971 | Bohn ........................ 439/638 |
| 4,199,209 | A | * | 4/1980 | Cherian et al. .............. 439/591 |
| 4,699,593 | A | * | 10/1987 | Grabbe et al. ................. 439/71 |
| 4,752,231 | A | * | 6/1988 | Olsson ......................... 439/66 |
| 5,123,848 | A | * | 6/1992 | August et al. ................. 439/66 |
| 5,248,262 | A | * | 9/1993 | Busacco et al. ............... 439/66 |
| 5,259,781 | A | * | 11/1993 | Baumberger et al. ........ 439/362 |
| 5,290,193 | A | * | 3/1994 | Goff et al. ................... 439/331 |
| 5,358,411 | A | * | 10/1994 | Mroczkowski ............... 439/66 |
| 5,493,237 | A | * | 2/1996 | Voltz et al. .................. 324/754 |
| 5,498,166 | A | * | 3/1996 | Rothenberger ............... 439/66 |
| 6,220,869 | B1 | * | 4/2001 | Grant et al. .................. 439/66 |

FOREIGN PATENT DOCUMENTS

JP      10-275667      10/1998

OTHER PUBLICATIONS

Official Letter from Japanese Patent Office for Japanese Patent Application No. 2000–403208.

* cited by examiner

Primary Examiner—Ross Gushi
(74) Attorney, Agent, or Firm—Finnegan, Henderson, Farabow, Garrett & Dunner, LLP

(57) ABSTRACT

An intermediate portion between groups of contact pins in a lead frame of a contact pin module is supported by a supporting plate.

8 Claims, 13 Drawing Sheets

CONTACT PIN MODULE AND TESTING DEVICE PROVIDED WITH THE SAME

This application is based on Patent Application No. 2000-403208 filed Dec. 28, 2000 in Japan, the content of which is incorporated hereinto by reference.

BACKGROUND OF THE INVENTION

1. Field of the Invention

The present invention relates to a contact pin module used for testing an electronic circuit in an object to be tested having the internal electronic circuit and a testing device provided with the same.

2. Description of the Related Art

Semiconductor integrated circuits mounted to an electronic equipment or others are subjected to various tests at a stage prior to being actually mounted so that latent defects therein are removed. These tests are carried out in a non-destructive manner by the application of voltage stress and the operation and reservation at a high temperature corresponding to a thermal and mechanical environmental tests. Among these tests, there is a burn-in test effective for removing initial-inoperable integrated circuits, in which the operational test is carried out for a predetermined time under a high temperature condition.

An inspection jig used for the burn-in test is generally referred to as an IC socket, for example, disclosed in Japanese Patent Application Laid-open No. 10-275667 (1998), comprising a printed circuit board (a printed board) having an input/output section through which a predetermined test voltage is supplied to and an abnormality-detection signal representing a short-circuit or others is returned from an object to be tested, a object under test accommodating member (a socket body) having an accommodation section for mounting a semiconductor element (semiconductor integrated circuits), for example, of a BGA (ball grid array) type to be tested, a cover member (a lid) having a pressing section (a pressure plate) in contact with an upper surface of the semiconductor element and pressing the same at a predetermined pressure, for covering an upper part of the object under test accommodating member, and a hook member rotational moveable held by the cover member and engaged with the object under test accommodating member to fix the cover member to the object under test accommodating member.

The object under test accommodating member is provided with a contact pin module which is a collectivity of contact pins for electrically connecting terminals of the semiconductor element with electrodes of the printed circuit board. Such a contact pin module is formed of a plurality of lead frames superposed with each other, each lead frame being formed of contact pins electrically connected to the respective terminals of the semiconductor element and contact pins electrically connected to the respective electrodes of the printed circuit board, which contact pins are continuously arranged in the same plane while confronting each other.

For example, as shown in FIG. 14, a contact pin module 2 includes a semiconductor element 6 mounted to a socket body (not shown) as an object to be tested, a plurality of lead frames 4 electrically interconnected to a printed board 8 for inputting/outputting a test signal relative to the semiconductor element 6, and an upper frame member 12 and a lower frame member 10 in association with each other for accommodating the plurality of lead frames 4.

In this regard, FIG. 14 illustrates only one lead frame 4 in two or more lead frames 4 superposed with each other, and eliminates the other of them.

The lead frame 4 consists of a plurality of contact pins $4Ci$ ($i=1$ to $n$ wherein n is an integer) formed at a predetermined interval in the same plane. The numbers of the lead frames 4 and the contact pins $4Ci$ are selected, for example, in accordance with the arrangement and the number of terminals of the semiconductor element 6.

The contact pin $4Ci$ consists of a object under test-side end portion 4A to be guided in a movable manner into an aperture $12b$ of the upper frame member 12 and coming in contact with the terminal of the semiconductor element 6, a printed board-side end portion 4B to be guided into an aperture $10b$ of the lower frame member 10 and coming in contact with an electrode pad of the printed board 8, and a curved connecting portion 4D connecting the object under test end portion 4A to the printed board end portion 4B.

According to this structure, when the semiconductor element 6 is pressed toward the contact pins $4Ci$-side with the above-mentioned pressing section, the object under test-side end portion 4A moves through a predetermined distance against the elastic force of the connecting portion 4D. Thus, due to the elastic force corresponding to the deflection of the connecting portion 4D, the object under test-side end portion 4A and the printed board-side end portion 4B of the contact pin $4Ci$ are brought into contact and thereby electrically connected with the terminal of the semiconductor element 6 and the electrode pad of the printed board 8, respectively, with substantially the same contacting force.

As another embodiment different from the curved contact pin $4Ci$ formed in one piece, a contact pin 14 shown in FIG. 15 may include a object under test-side contact member 18 to be in contact with a terminal of the semiconductor element 6, a printed board-side contact member 22 to be in contact with an electrode pad of the printed board 8, a spring member 20 disposed between one end of the object under test-side contact member 18 and one end of the printed board-side contact member 22 to transmit a bias corresponding to the displacement of the object under test-side contact member 18 to the printed board-side contact member 22, and a casing member 16 for accommodating the spring member 20, the end of the object under test-side contact member 18 and the end of the printed board-side contact member 22.

Also in the above contact pin 14, the other ends of the object under test-side contact member 18 and the printed board-side contact member 22 are brought into contact with the terminal of the semiconductor element 6 and the electrode pad of the printed board 8, respectively, with substantially the same contacting force. At that time, if a proper contacting force at the object under test-side contact member (end portion) and that at the printed board-side contact member (end portion) are different from each other, the above-mentioned bias of the contact pin is selected to be an intermediate value between the proper contacting forces at the object under test-side contact member (end portion) and that at the printed board-side contact member (end portion) since the bias of the contact pin is a single bias.

For obtaining the secure electrical connection at the object under test-side contact member (end portion) and the printed board-side contact member (end portion) of the contact pin between different objectives, however, it is necessary for each end of the contact pin to come in contact with the objectives to be connected electrically according to proper contacting force of the object under test-side contact member (end portion) and the printed board-side contact member (end portion) rather than contacting forces such an intermediate value.

SUMMARY OF THE INVENTION

In view of the above problems, an object of the present invention is to provide a contact pin module used for the test of an electronic circuit in an object to be tested having the same and a testing device provided with the contact pin module, capable of individually adjusting contacting forces with a terminal of the object to be tested and with an electrode of a printed circuit board having a signal input/ output section.

In accordance with the present invention which is proposed to attain the above object, there is provided contact pin module comprises a first connecting section formed of an elastic conductor and having a terminal portion electrically connected to a connecting terminal of an object to be tested including an electronic circuit, a second connecting portion consecutive to the first connecting portion and formed of an elastic conductor to be integral with the first connecting portion, the second connecting portion having a terminal portion electrically connected to an electrode of a board connected to a signal input/output section through which a test signal for the object to be tested is input and output, a supporting member disposed at an approximately intermediate position between the first and second connecting sections and supporting the conductor so that a contacting force of the terminal section of the first connecting section to the connecting terminal and a contacting force of the terminal portion of the second connecting portion to the electrode are individually adjustable, and a holding member for holding a plurality of the first connecting portions, the second connecting portions and the supporting members in a overlaid manner.

Also, the contact pin module according to the present invention comprises a first connecting portion having terminal portions formed of elastic conductor electrically connected to a plurality of connecting terminals, respectively, of an object to be tested and including electronic circuits therein, a second connecting portion having terminal portions formed of an elastic conductor consecutive to the first connecting portion and electrically connected to a plurality of electrodes, respectively, of a board connected to a signal input/output section for inputting and outputting a test signal for the object to be tested, a supporting member disposed at an intermediate position between the first and second connecting portions and supporting the conductor so that a contacting force of the terminal portion of the first connecting portion to the connecting terminal and a contacting force of the terminal portion of the second connecting portion to the electrode are individually adjustable, and a holding member for holding a plurality of the first connecting portions, the second connecting portions and the supporting members in a superposed manner.

Further, the contact pin module according to the present invention, wherein the conductor in the first and second connecting portions may comprise curved portions consecutive to the terminals portions, respectively, or radii of curvature in the first and second connecting portions may be approximately equal to each other.

The testing device according to the present invention comprises a contact pin module as defined in claim 1 or 2, an object under test accommodating member for positioning the contact pin module relative to a connecting portion of the contact pin module in a signal input/output portion and a connecting terminal of an object to be tested, the signal input/output section supplying a test signal to an object to be tested including an electronic circuit therein and delivering an output signal from the object to be tested via the contact pin module, and the object under test accommodating member for accommodating the contact pin module and the object to be tested thereinto, and a pressing mechanism for pressing the object to be tested placed on the contact pin module relative to the contact pin module.

As apparent from the above description, contact pin module and the testing device provided with the same according to the present invention since the supporting member is disposed at an approximately intermediate position between the first and second connecting portions and supporting the conductor to be capable of individually adjusting a contacting force of the terminal portion of the first connecting portion with the connecting terminal and a contacting force of the terminal portion of the second connecting portion with the electrode, it is possible to individually adjust the contacting force with the terminal of the object to be tested and that with the electrode of the printed circuit board having the signal input/output section, for example, by suitably selecting shapes of the first and second connecting portions.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 9:
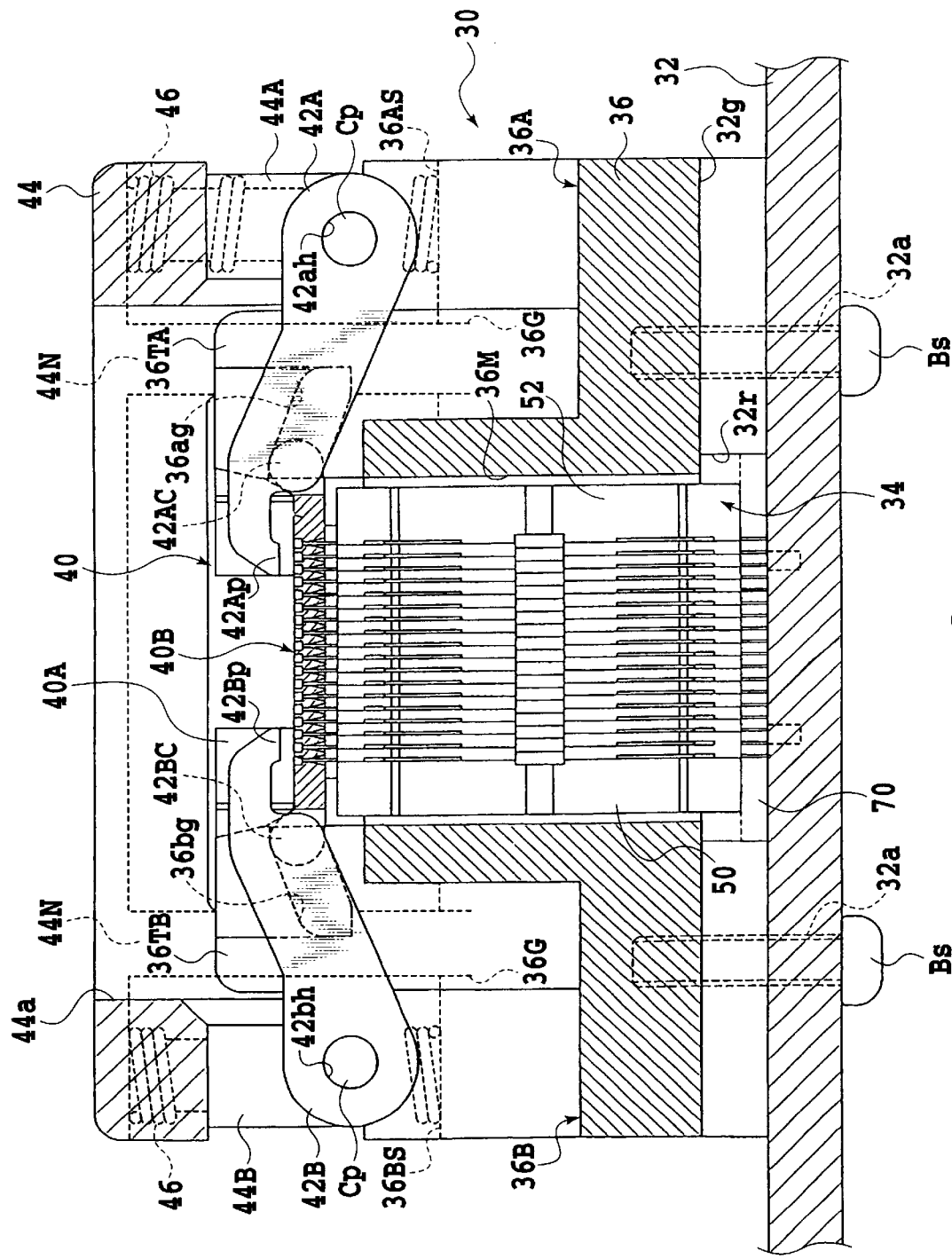
FIG. 9 is a sectional view showing a structure of one embodiment of a testing device according to the present invention.

FIG. 9 schematically illustrates a configuration of a main point of one embodiment of a testing device provided with the inventive contact pin module.

In FIG. 9, the testing device includes a printed circuit board 32 having an input/output section through which a predetermined test voltage is supplied to the printed circuit board and an abnormality-detection signal for representing a short-circuit or others is returned from the respective object to be tested, and object under test accommodating members 30, each having an accommodation section for mounting one of a plurality of semiconductor elements to be tested, which are disposed at predetermined positions on the printed circuit board 32 in all directions. In this regard, only one of a plurality of the object under test accommodating members 30 is shown in FIG. 9, and the other of them are eliminated.

Figure 10:
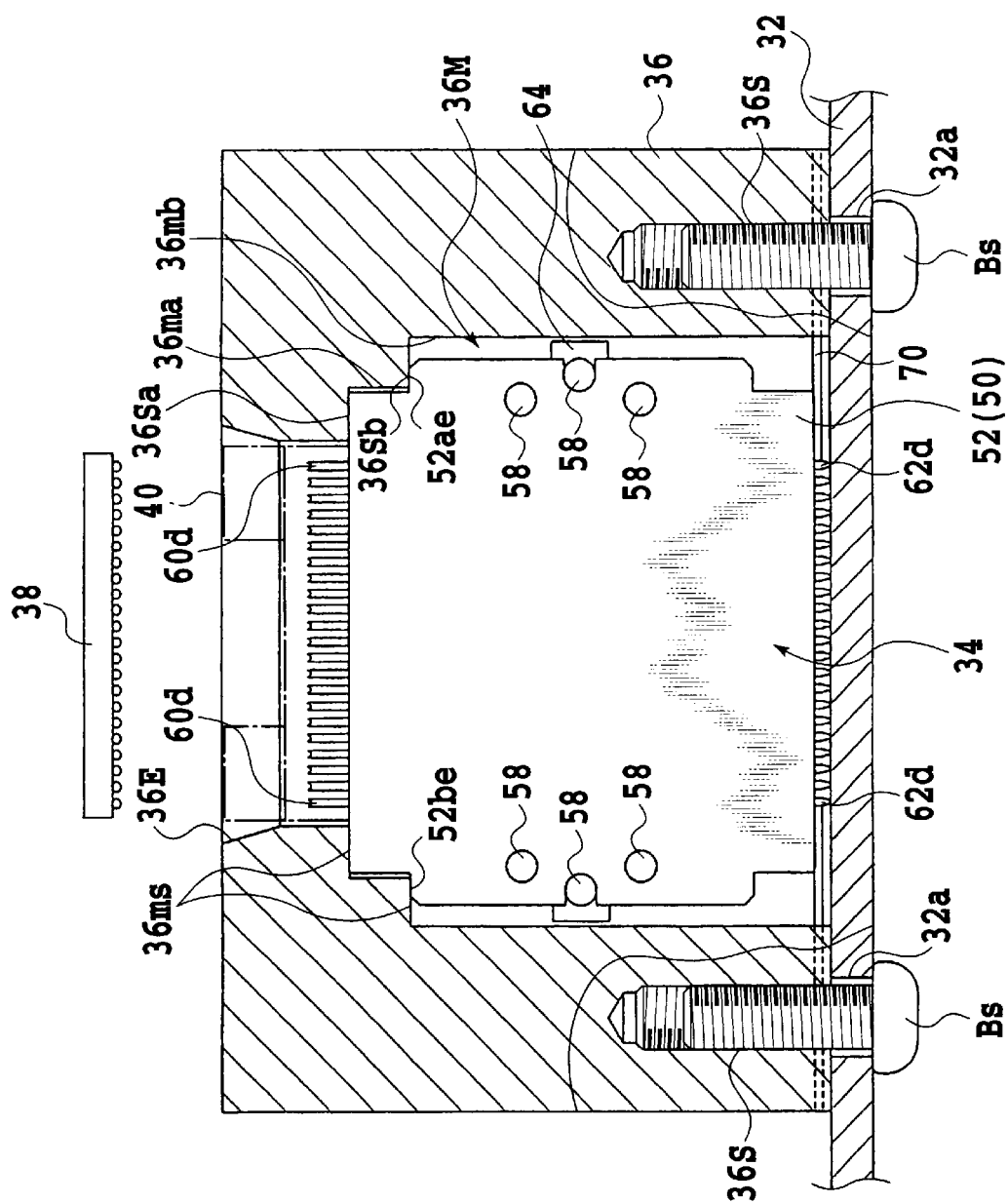
FIG. 10 is a partially sectional view of the embodiment shown in FIG. 9.

As shown in FIGS. 9 and 10, the object under test accommodating member 30 which is referred to as an so-called IC socket mainly includes a contact pin module 34 for electrically connecting the respective electrode pads (terminal portions) of the printed circuit board 32 with terminals of a semiconductor element 38, a socket body 36 for accommodating the contact pin module 34 to be connected to the respective electrode pads (terminal portions) of the printed circuit board 32 disposed at predetermined positions on the printed circuit board 32, a alignment plate 40 as a positioning member placed on the upper surface of the contact pin module 34 for alignment between the respective electrodes of the semiconductor element 38 and the terminal portions of the contact pin module 34 and accommodating the semiconductor element 38, a movable member 44 for selectively rotating a pair of pressing members 42A and 42B described later, disposed above the alignment plate 40 to be movable upward and downward while encircling the contact pin module 34 in the socket body 36, and the pressing members 42A and 42B for pressing the respective terminals of the semiconductor element 38 with respect to the contact pin module 34 via the alignment plate 40 in accordance with the upward motion of the movable member 44.

The semiconductor element 38 as object to be tested is of a BGA type which is, for example, approximately 11 mm in square. On a surface of the semiconductor element 38 of approximately square in form opposite to the alignment plate 40 described later, a plurality of bump-shaped electrodes to be electrically connected to the contact pin module 34 through apertures in the alignment plate 40 are formed as terminals all over the surface at a predetermined pitch.

The socket body 36 is molded from a heat-resistant plastic material. Four female-threaded holes 36S of a predetermined depth are provided in a lower portion of the socket body 36. A lower surface of the socket body 36 is placed at a predetermined position on the printed circuit board 32 and screwed thereto by screws Bs via through-holes 32a into the female-threaded holes 36S. The through-holes 32a are provided at predetermined four positions on the printed circuit board 32 in correspondence to the female-threaded holes 36S. Also, in the lower portion of the socket body 36, a recess 32g extending in the longitudinal direction thereof is formed throughout the lower surface. Further, another recess 32r to be engaged with a lower side-alignment plate/positioning plate described later intersects the recess 32g in a central area of the lower portion of the socket body 36.

Figure 11:
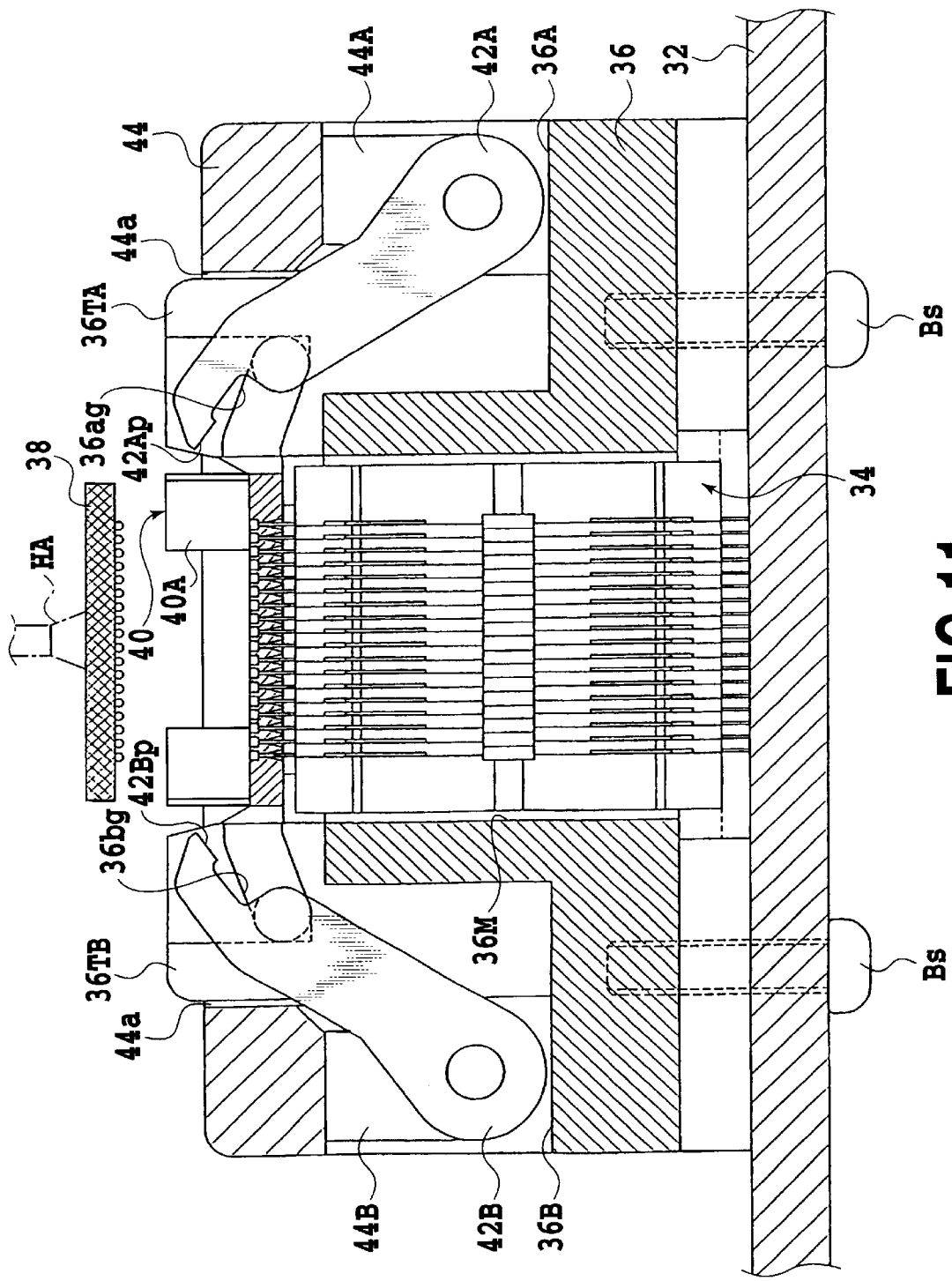
FIG. 11 is a sectional view for explaining the operation of the embodiment shown in FIG. 9.

A module accommodating section 36M for accommodating the contact pin module 34 is defined approximately in a central portion of the socket body 36. On the periphery of the module accommodating section 36M, recesses 36A and 36B are provided face-to-face. As shown in FIG. 11, a lower end of an arm member 44A or 44B and a proximal end of a pressing member 42A or 42B are selectively inserted in the recess 36A or 36B respectively. Also, at each of the opposite ends of the recess 36A as seen vertical to a paper plane of FIG. 9, a spring receiving section 36AS for locating one end of a coil spring described later is defined. At each of the opposite ends of the recess 36B as seen vertical to a paper plane, a spring receiving section 36BS for locating one end of a coil spring described later is defined.

As shown in FIG. 9, a guide member 36TA is formed between the recess 36A and the module accommodating section 36M. The guide member 36TA has a gap through which the pressing member 42A is movable and a pair of opposite walls defining the gap. In the respective wall, a groove 36ag inclined toward obliquely downward at a predetermined angle in the righthand direction as seen in FIG. 9 is formed for guiding a guide pin of the pressing member 42A described later.

Another guide member 36TB is formed between the recess 36B and the module accommodating section 36M. The guide member 36TB has a gap through which the pressing member 42A is movable and a pair of opposite walls defining the gap. In the respective wall, a groove 36bg inclined toward obliquely downward at a predetermined angle in the lefthand direction to intersect the extension line of the groove 36ag is formed for guiding a guide pin of the pressing member 42B described later.

As shown in FIG. 10, the module accommodating section 36M consists of a small diameter portion 36ma and a large diameter portion 36mb. The small diameter portion 36ma and the large diameter portion 36mb communicate with an approximately square-shaped opening 36E of the socket body 36 and can properly position the relative location of the accommodated contact pin module 34 relative to the opening 36E of the socket body 36. In this regard, the opening 36E, the small diameter portion 36ma and the large diameter portion 36mb are formed on a common center axis.

Figure 2:
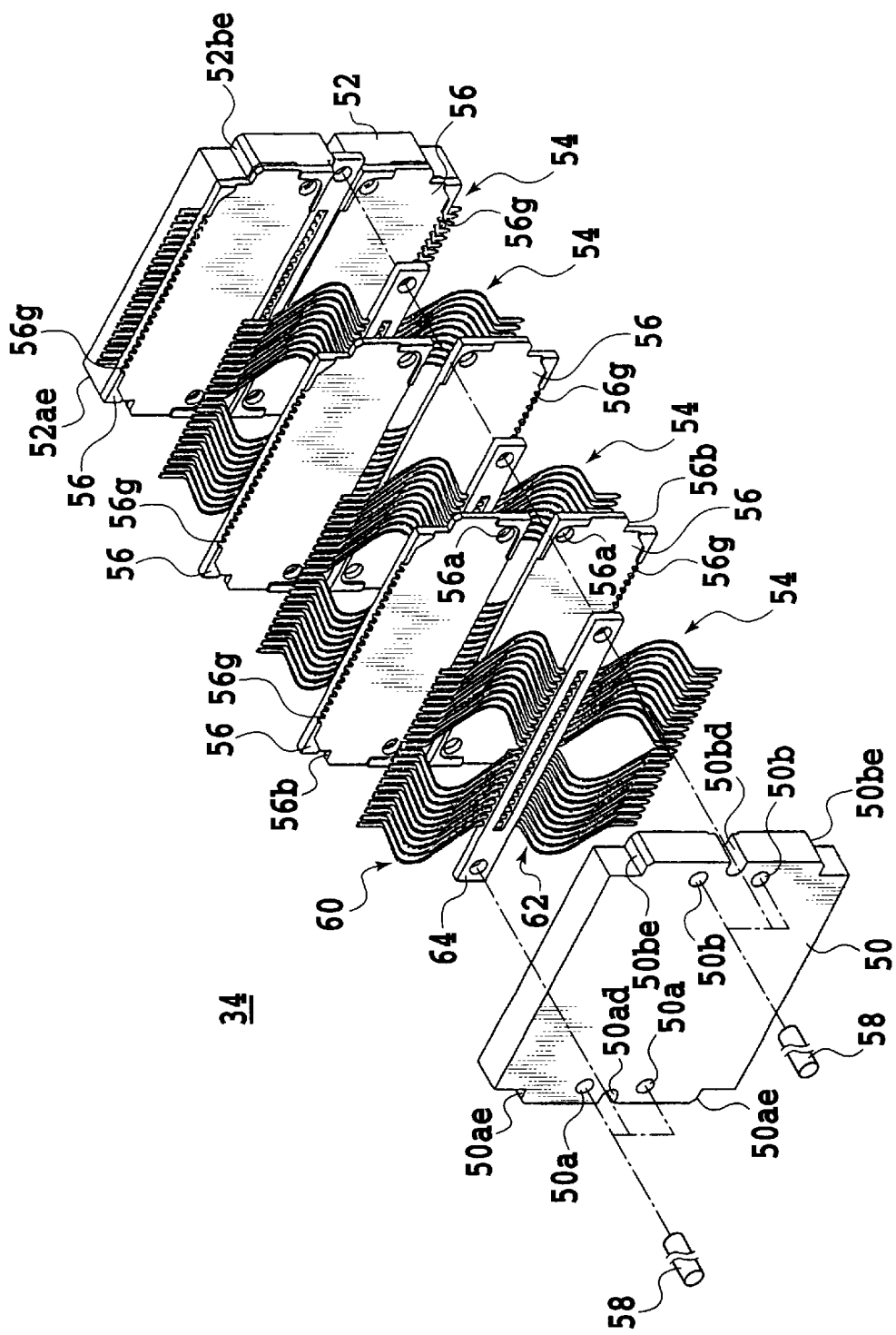
FIG. 2 is an exploded perspective view of the embodiment shown in FIG. 1 illustrating the respective components thereof.

A surface 36sa contiguous to the small diameter portion 36ma and the periphery of the opening 36E is brought into contact with side plates 52 and 50 of the contact pin module 34. Also, as shown in FIGS. 2 and 9, a surface 36sb contiguous to the large diameter portion 36mb and the small diameter portion 36ma, and an inner surface of the small diameter portion 36ma are brought into contact with shoulders 52ae, 52be, 50ae and 50be of the side plates 52 and 50 of the contact pin module 34. Accordingly, the contact pin module 34 and the terminal portions 60d are positioned relative to the periphery of the opening 36E of the socket body 36 and the alignment plate 40 described later.

The lower side-alignment plate/positioning plate 70 to be engaged with the recess 32r supports printed circuit board 32 side-terminal portions 62d of the contact pin module 34. The lower side-alignment plate/positioning plate 70 has a plurality of through-holes corresponding to the terminal portions 62d on the printed circuit board 32 side, and as shown in FIGS. 9 and 10, has positioning pins engageable with holes of the printed circuit board 32. Thus, the terminal portions 62d on the printed circuit board 32-side are positioned relative to the electrode pads of the printed circuit board 32. At this time, the terminal portion 62d on the printed circuit board 32 side is displaced at a predetermined distance when the printed circuit board 32 is fixed to the socket body 36 by means of the screws Bs. Accordingly, the terminal portion 62d on the printed circuit board 32 side is brought into contact with the electrode pad of the printed circuit board 32 at a predetermined contacting force.

As shown in FIG. 9, the alignment plate 40 includes positioning parts 40A for supporting four corners of the semiconductor element 38 as an object to be tested, respectively, and a planar part 40B having a center axis in common with a center of the four positioning parts 40A encircling the same.

The planar part 40B has relatively small indents arranged in all directions in correspondence to the respective terminals of the semiconductor element 38. The each indent communicates with a through-hole in which the terminal portion 60*d* of the contact pin module 34 is inserted in a movable manner. Accordingly, by the indent, the respective terminal of the semiconductor element 38 is positioned relative to the planar part 40B, and the respective terminal of the semiconductor element 38 is positioned relative to the terminal portion 60*d* of the contact pin module 34.

The alignment plate 40 is supported by a supporting mechanism not shown to be movable in a certain extent in the pressure direction of the pressing members 42A and 42B.

In this regard, while the alignment plate 40 is used in the above-mentioned embodiment upon positioning the respective terminal of the semiconductor element 38 relative to the terminal portion 60*d* of the contact pin module 34, the present invention should not be limited thereto, but the relative location of the respective terminal of the semiconductor element 38 may be positioned relative to the terminal portion 60*d* of the contact pin module 34, for example, by the engagement of the semiconductor element 38 with the peripheral wall of the opening 36E formed to be engageable with the outer circumference of the semiconductor element 38.

In FIG. 9, at each of the opposite ends of the socket body 36 as seen in the vertical direction to a paper plane, a groove 36G engageable with four hooks 44N of the movable member 44 in a movable manner is formed along the moving direction of the movable member 44. A tip end of the hook 44N is attached at the end of the respective groove 36G when the movable member 44 is at the elevated position as shown in FIG. 9.

As shown in FIG. 11, the frame-like movable member 44 has an opening 44*a* in a central area thereof, through which the outer circumference of the semiconductor element 38 and the upper end of the guide member 36TA, 36TB pass. At surfaces of the movable member 44 opposite to the recesses 36A and 36B, the arm members 44A and 44B are projected in a vertical direction, respectively. The arm member 44A is provided as a pair so that the proximal end of the pressing member 42A is interposed between the pair while leaving a predetermined gap therefrom. The respective arm member 44A has a hole capable of inserting a connecting pin CP therethrough for coupling the arm member 44A with the pressing member 42A.

Similarly, the arm member 44B is provided as a pair so that the proximal end of the pressing member 42B is interposed between the pair while leaving a predetermined gap therefrom. The respective arm member 44B has a hole capable of inserting a connecting pin CP therethrough for coupling the arm member 44B with the pressing member 42B.

At each of longitudinal opposite ends of the movable member 44, the hook 44N engageable with the groove 36G of the socket body 36 is projected toward the socket body 36.

At four positions in an area of the movable member 44 opposite to the spring receiving portions 36AS and 36BS of the socket body 36, spring receiving portions are provided, respectively. In each of the latter spring receiving portions, the other end of the coil spring 46 for biasing the movable member 44 in the direction away from the socket body 36 is accommodated. That is, the coil spring 46 is disposed between the latter spring receiving portion and the spring receiving portion 36AS, 36BS.

The pressing member 42A includes a proximal end portion having a hole 42*ah* into which the connecting pin CP is inserted to be relatively rotational moveable, a pressing surface section 42AP selectively in contact with the upper surface of the semiconductor element 38, and a connecting portion for connecting the proximal end with the pressing surface 42AP.

The connecting portion of the pressing member 42A is provided with a guide pin 42AC moveably engageable with both the grooves 36*ag*.

The pressing member 42B includes a proximal end portion having a hole 42*bh* into which the connecting pin CP is inserted to be relatively rotational moveably, a pressing surface section 42BP selectively in contact with the upper surface of the semiconductor element 38, and a connecting portion for connecting the proximal end with the pressing surface 42BP.

The connecting portion of the pressing member 42B is provided with a guide pin 42BC moveably engageable with both the grooves 36*bg*.

Thus, as shown in FIG. 11, when the movable member 44 is pressed against the bias of the coil spring 46 toward the socket body 36, the proximal end portions of the pressing members 42A and 42B are lowered in synchronism with each other respectively and the guide pins 42AC and 42BC are guided along the grooves 36*ag* and 36*bg*, respectively, whereby the pressing surface sections 42AP and 42BP of the pressing members 42A and 42B are apart from each other. In other words, the upper space of the module accommodating section 36M of the socket body 36; i.e., the upper space of the alignment plate 40 becomes free.

On the other hand, when the movable member 44 is elevated by the bias of the coil spring 46 as shown in FIG. 9, the proximal end portions 42A and 42B are also elevated in synchronism with each other and the guide pins 42AC and 42BC are guided along the grooves 36*ag* and 36*bg*, respectively, whereby the pressing surface portions 42AP and 42BP of the pressing members 42A and 42B are close to each other. In other words, the pressing surface portions 42AP and 42BP of the pressing members 42A and 42B enter the alignment plate 40 of the socket body 36.

Figure 1:
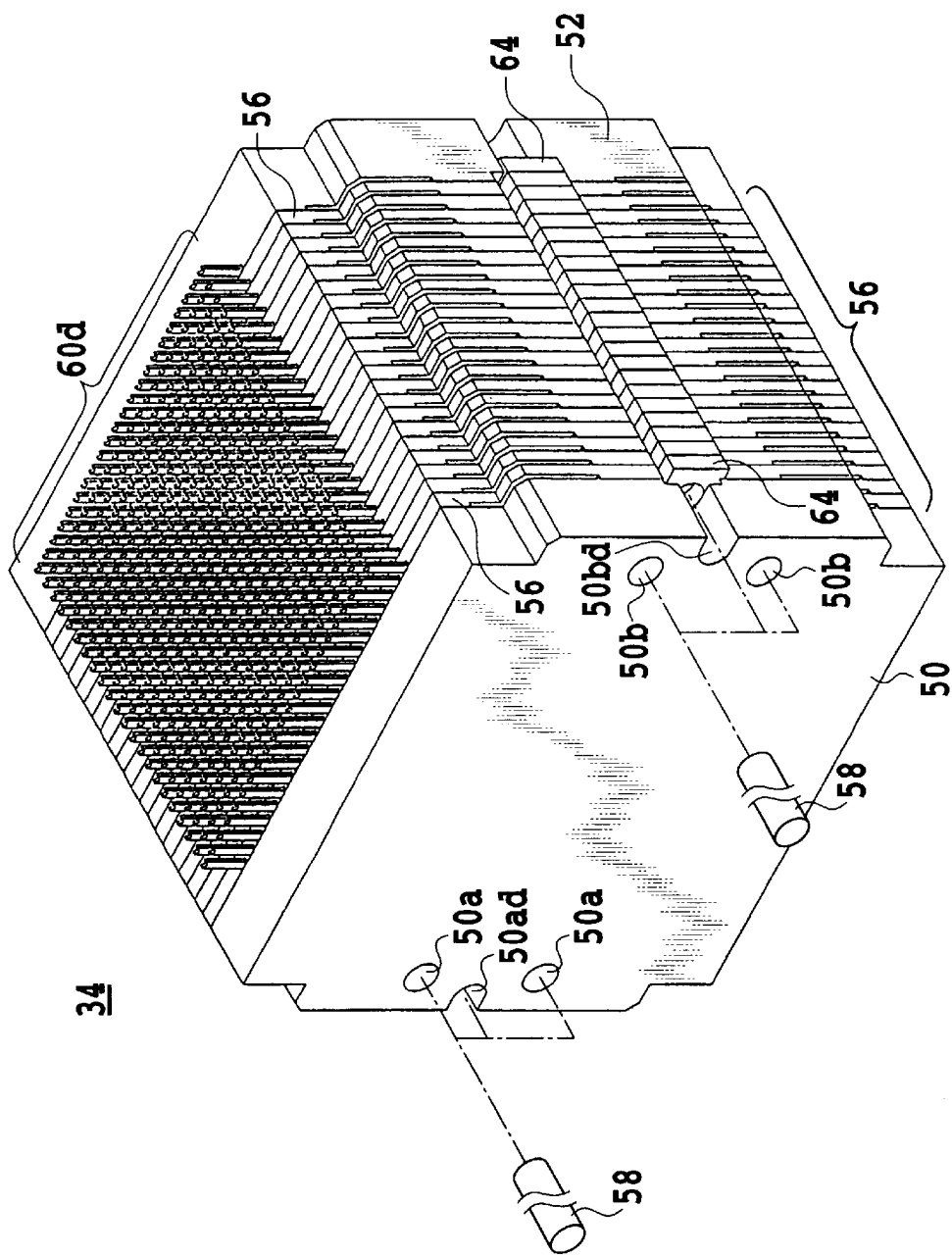
FIG. 1 is a perspective view of an appearance of one embodiment of a contact pin module according to the present invention.

As shown in FIGS. 1 and 2, the contact pin module 34 mainly consists of the side plates 50 and 52 defining the opposite ends thereof, and a plurality of lead frames 54 superposed between the side plates 50 and 52 generally parallel with each other via spacers 56.

The side plates 50 and 52 are made, for example, of a plastic material to be of the same structure, and therefore the explanation will be made on the side plate 50 while that on the side plate 52 is eliminated.

The side plate 50 has notches 50*ad* and 50*bd* at opposite ends thereof, into which connecting pins 58 described later are to be inserted. Through-holes 50*a* which connecting pin 58 are fitted, are provided at two positions while interposing the notch 50*ad* of the side plate 50. Similarly, through-holes 50*b* which connecting pin 58 are fitted, are provided at two positions while interposing the notch 50*bd* of the side plate 50.

Shoulders 50*ae* and 50*be* are formed at four corners of both end of the side plate 50, respectively.

Each of the spacers 56 of a thin sheet is made of an insulating material and has two through-holes 56*a* with which the connecting pins 58 are fitted at positions corresponding to the through-holes 50a, 50b, 52a and 52b of the side plates 50 and 52. Also, the respective spacer 56 has shoulders 56b at positions corresponding to the shoulders 50ae, 50bc, 52ae and 52bc of the side plates 50 and 52.

Figure 6:
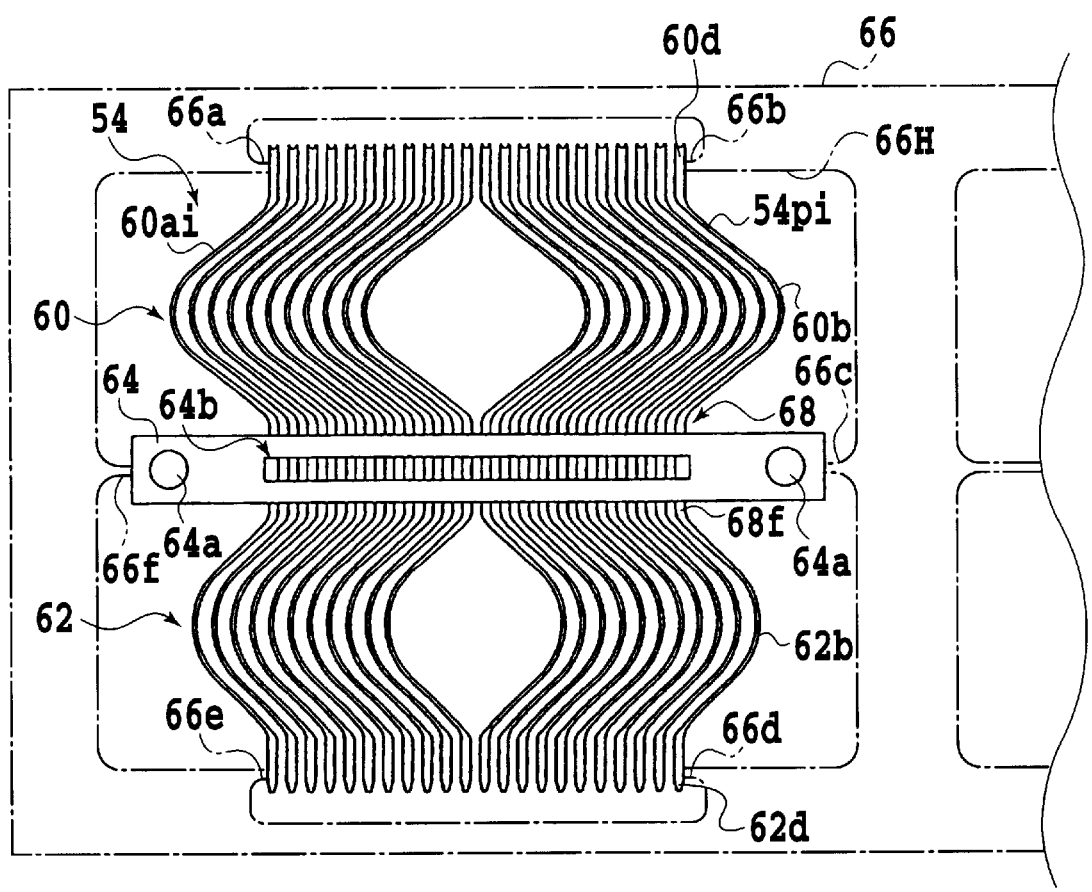
FIG. 6 is a plan view of an important point of a lead frame used for the embodiment shown in FIG. 1.

As shown in FIG. 6, the lead frame 54 includes group 60 of contact pins as a first connecting portion to be electrically connected to the terminals of the semiconductor element 38, a group 62 of contact pins as a second connecting portion to be electrically connected to the electrodes of the printed circuit board 32 formed in the same plane as that of the group 60 of contact pins, and a supporting plate 64 provided in a connecting portion 68 between the group 60 of contact pins and the group 62 of contact pins for supporting both the groups 60 and 62.

In the lead frame 54, a contact pin 54pi (i=1 to n; n is an integer) forming the groups 60 and 62 consists of a single lead, respectively. In this regard, the number n of the contact pins 54pi is selected in accordance with the number of the terminals and the arrangement of the semiconductor element or the number of the electrode pads of the printed circuit board 32. Also, a mutual distance between the contact pins 54pi is selected in accordance with a pitch of the terminals in the semiconductor element 38 and a pitch of the electrodes in the printed circuit board 32.

The contact pin 54pi includes the terminal portion 60d forming a terminal group of the contact pin group 60, a connecting line portion 68f supported by the supporting plate 64, a curved portion 60b for connecting the connecting line portion 68f with the terminal portion 60d, the terminal portion 62d forming a terminal group of the contact pin group 62, and a curved portion 62b for connecting the connecting line portion 68f with the terminal portion 62d.

A linear tip end of the terminal portion 60d is formed in an arcuate shape, for example, in accordance with a shape of the terminal of the semiconductor element 38. A thickness, a width and a radius of curvature of the curved portion 60b are set in accordance with a proper contacting force between the terminal of the semiconductor element 38 and the tip end of the terminal portion 60d,respectively. Accordingly, a bending rigidity (a spring constant) of the curved portion 60b; i.e., an elastic force generated due to the displacement of the curved portion 60bis set in accordance with the proper contacting force between the terminal of the semiconductor element 38 and the tip end of the terminal portion 60d. At this time, the radii of curvature of the curved portions 60b of the adjacent contact pins 54pi are approximately equal to each other so that the contacting forces of the respective terminal portions 60d become approximately equal.

The connecting line portion 68f is linearly formed on substantially the same straight line as the terminal portion 60d.

A linearly formed tip end of the terminal portion 62d is of a pinnacle shape to reduce an electric resistance, for example, relative to the electrode pad of the printed circuit board 32. A thickness, a width and a radius of curvature of the curved portion 62b are set in accordance with a proper contacting force between the electrode pad of the printed circuit board 32 and the tip end of the terminal portion 62d, respectively.

Accordingly, a bending rigidity (a spring constant); i.e., an elastic force generated due to the displacement of the curved portion 62b is set in accordance with the proper contacting force between the electrode pad of the printed circuit board 32 and the tip end of the terminal portion 62d. At this time, the radii of curvature of the curved portions 62b of the adjacent contact pins 54pi are approximately equal to each other so that the contacting forces of the respective terminal portions 62d become approximately equal. A length between the tip end of the terminal portion 62d and the vicinity of the connecting line portion 68f is approximately equal to a length between the tip end of the terminal portion 60d and the vicinity of the connecting line portion 68f.

Figure 7:
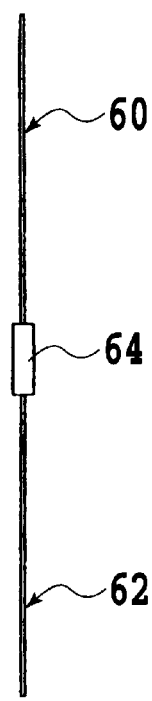
FIG. 7 is a side view of the lead frame shown in FIG. 6.
Figure 8:
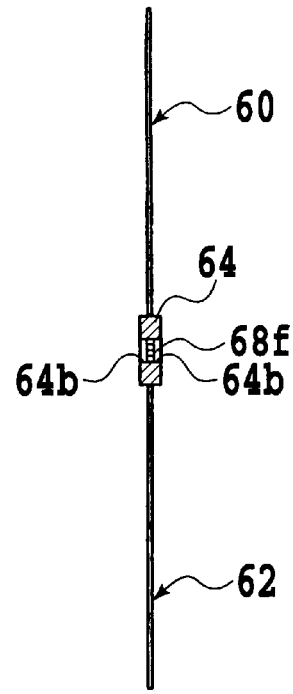
FIG. 8 is a partially sectional view of the lead frame shown in FIG. 6 as seen from a lateral side.

The supporting plate 64 molded of a resinous material is formed to cover the outer circumference of the connecting line portion 68f as shown in FIGS. 7 and 8. Also, the supporting plate 64 has an opening 64b in a central area thereof. Further, there is a through-hole 64a at each of the opposite ends of the supporting plate 64, into which the above-mentioned connecting pin 58 is inserted.

That is, the contacting forces in the contact pin groups 60 and 62 are individually set by changing shapes of the curved portions 60b and 62b, respectively. Moreover, since the contacting forces are individually set by changing the shapes of the curved portions 60b and 62b while determining the length between the tip end of the terminal portion 62d and the vicinity of the connecting line portion 68f to be approximately equal to the length between the tip end of the terminal portion 60d and the vicinity of the connecting line portion 68f, it is readily possible to miniaturize the contact pin module.

When the lead frame 54 is manufactured, a thin sheet raw material for the frame member is, for example, first subjected to a predetermined etching treatment and then resin-coating treatment and the like to form the lead frame 54 having the supporting plate 64 in each of a plurality of openings 66H in one frame member 66 as shown in FIG. 6. Next, connecting portions 66a, 66b, 66c, 66d, 66e and 66f connecting the lead frame 54 with the periphery of the respective openings 66H are cut to result in the individual lead frames 54.

Then, upon assembling the contact pin module 34, as shown in FIG. 2, the obtained lead frames 54 are alternately spaced with a set of spacers 56 and the obtained lead frames 54 superposed.

Figure 3:
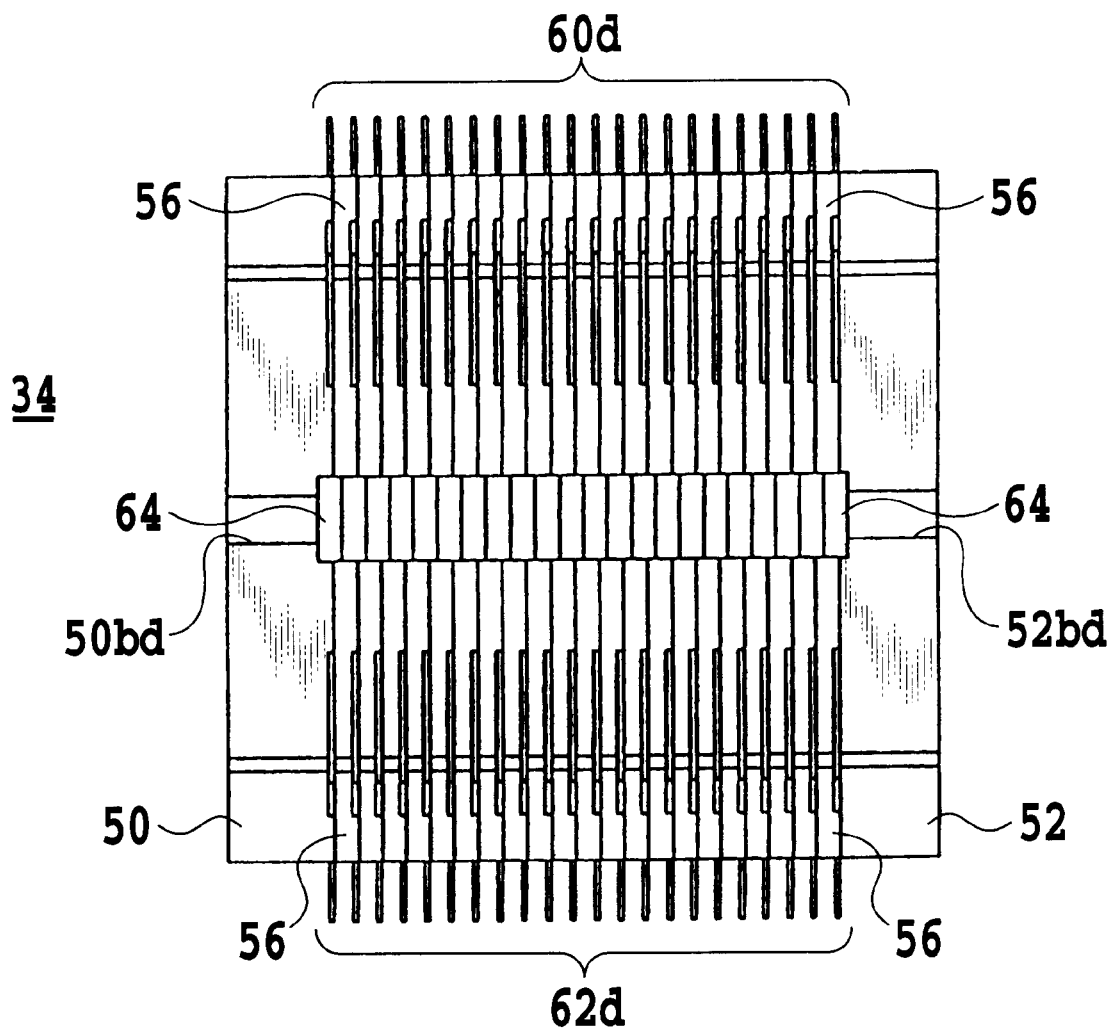
FIG. 3 is a side view of the embodiment shown in FIG. 1.
Figure 4:
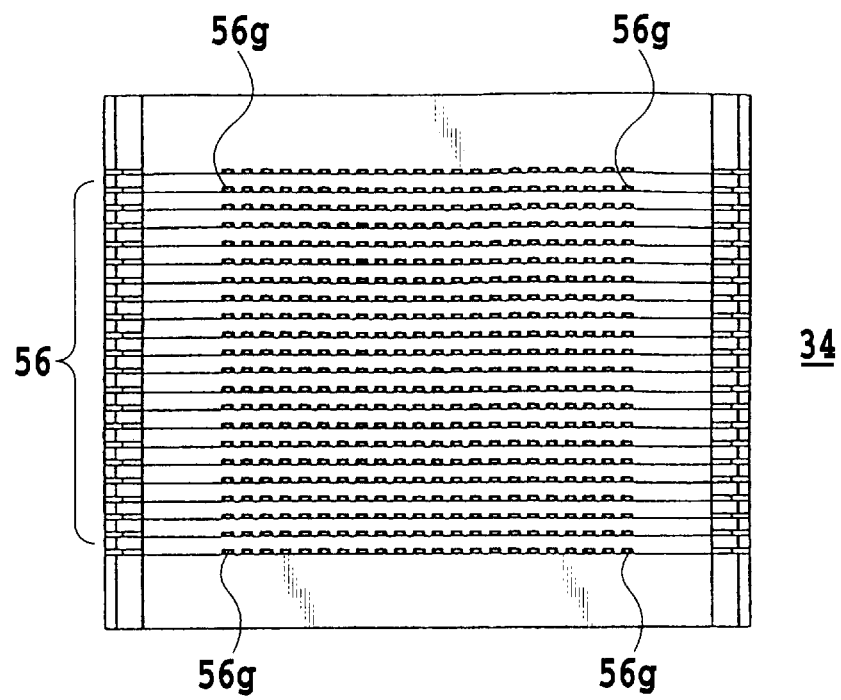
FIG. 4 is a plan view of the embodiment shown in FIG. 1.

At that time, the set of spacers 56 are disposed so that the through-holes 56a thereof are aligned with the through-holes 50a, 50b, 52a and 52b of the side plates 50 and 52 as well as the through-holes 64a of the supporting plate 64 in the lead frame 54 are aligned with the notches 50ad, 50bd, 52ad and 52bd of the side plates 50 and 52. Further, as shown FIGS. 1, 3 and 4, the terminal portions 60d and 62d of the lead frame 54 are fit into the respective recesses 56g, respectively.

Subsequently, the superimposed lead frames 54 over the spacers 56 are pinched by the side plates 50 and 52 as shown in FIG. 2.

Figure 5:
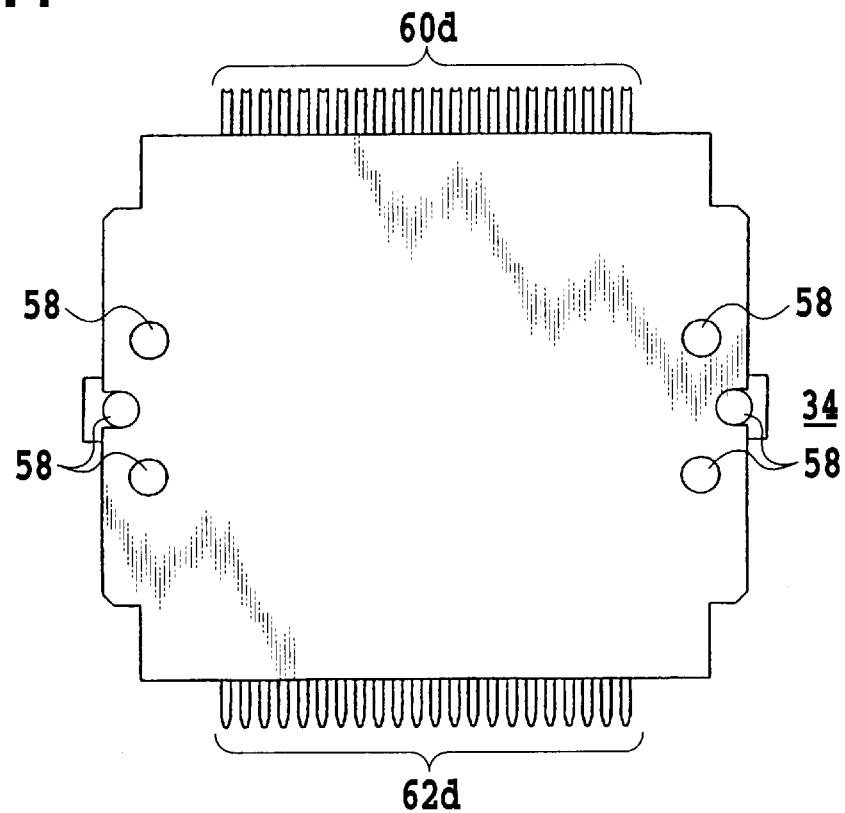
FIG. 5 is a front view of the embodiment shown in FIG. 1.

To integrate the lead frames 54, the spacers 56 and the side plates 50, 52 together, the connecting pins 58 are inserted into the through-holes 50a, 50b, 52a and 52b, and also the connecting pins 58 are inserted into the through-holes 64 via the notches 50ad and 50bd. Thus, the contact pin module 34 is completed as shown in FIG. 5.

In such a structure, upon testing the semiconductor element 38, a front end of an arm of a work robot not shown is first brought into contact with the upper surface of the movable member 44 as shown in FIG. 11 to press the latter downward against the bias of the coil spring 46. Thereby the pressing members 42A and 42B are in an open state. Also, the semiconductor element 38 as an object to be tested is held by a suction of an conveying arm HA of carrying robot not shown and transferred to a position directly above the opening 44a of the movable member 44 and the positioning part 40A of the alignment plate 40.

Figure 12:
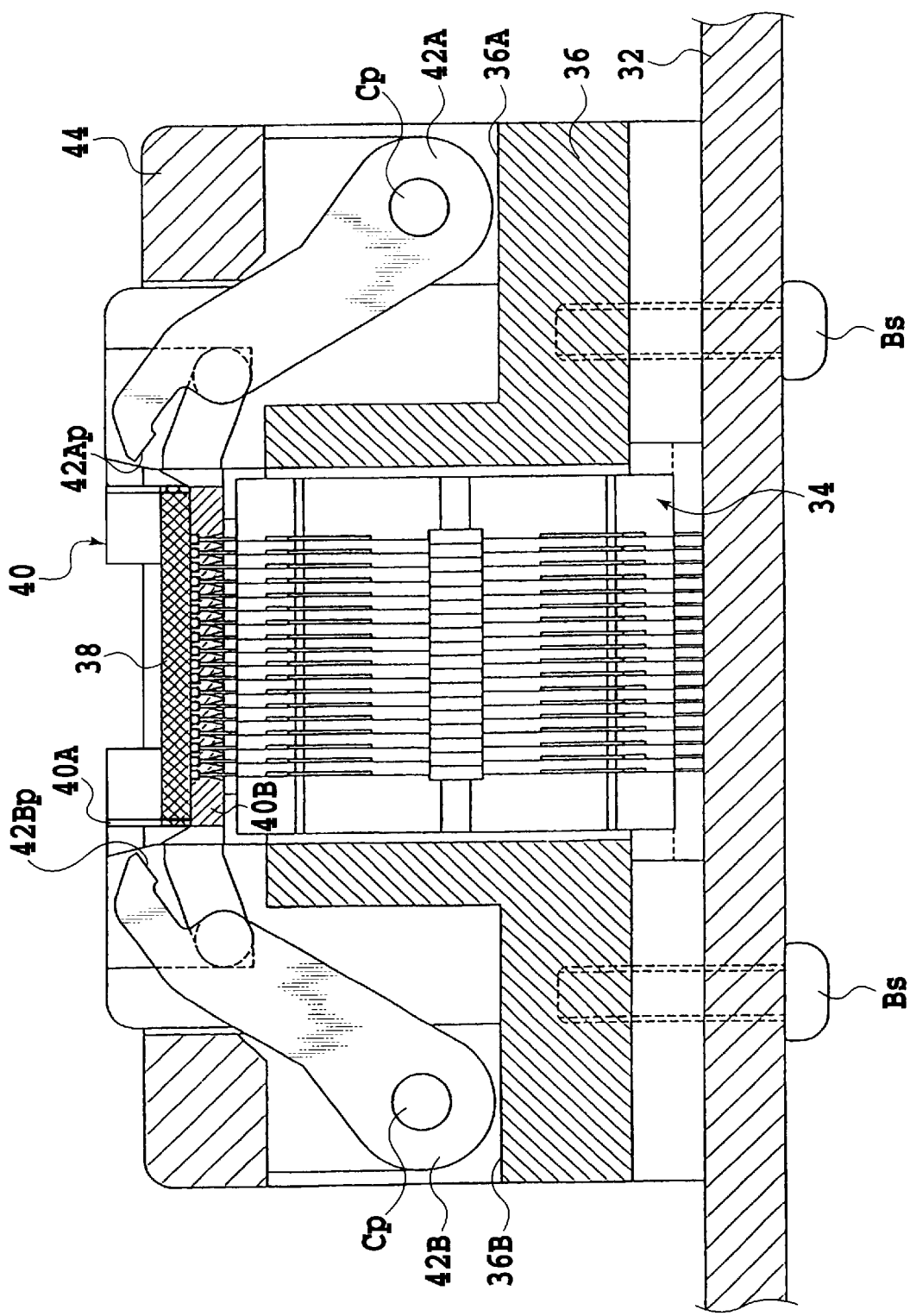
FIG. 12 is a sectional view for explaining the operation of the embodiment shown in FIG. 9.

Then, the semiconductor element 38 held by a suction of the conveying arm HA is moved downward through a space defined between the pressing members 42A and 42B to be located and mounted onto the planar part 40B via the positioning parts 40A. At this time, as shown in FIG. 12, the respective terminals of the semiconductor element 38 are correspondingly brought into contact with the indents of the planar part 40B.

Figure 13:
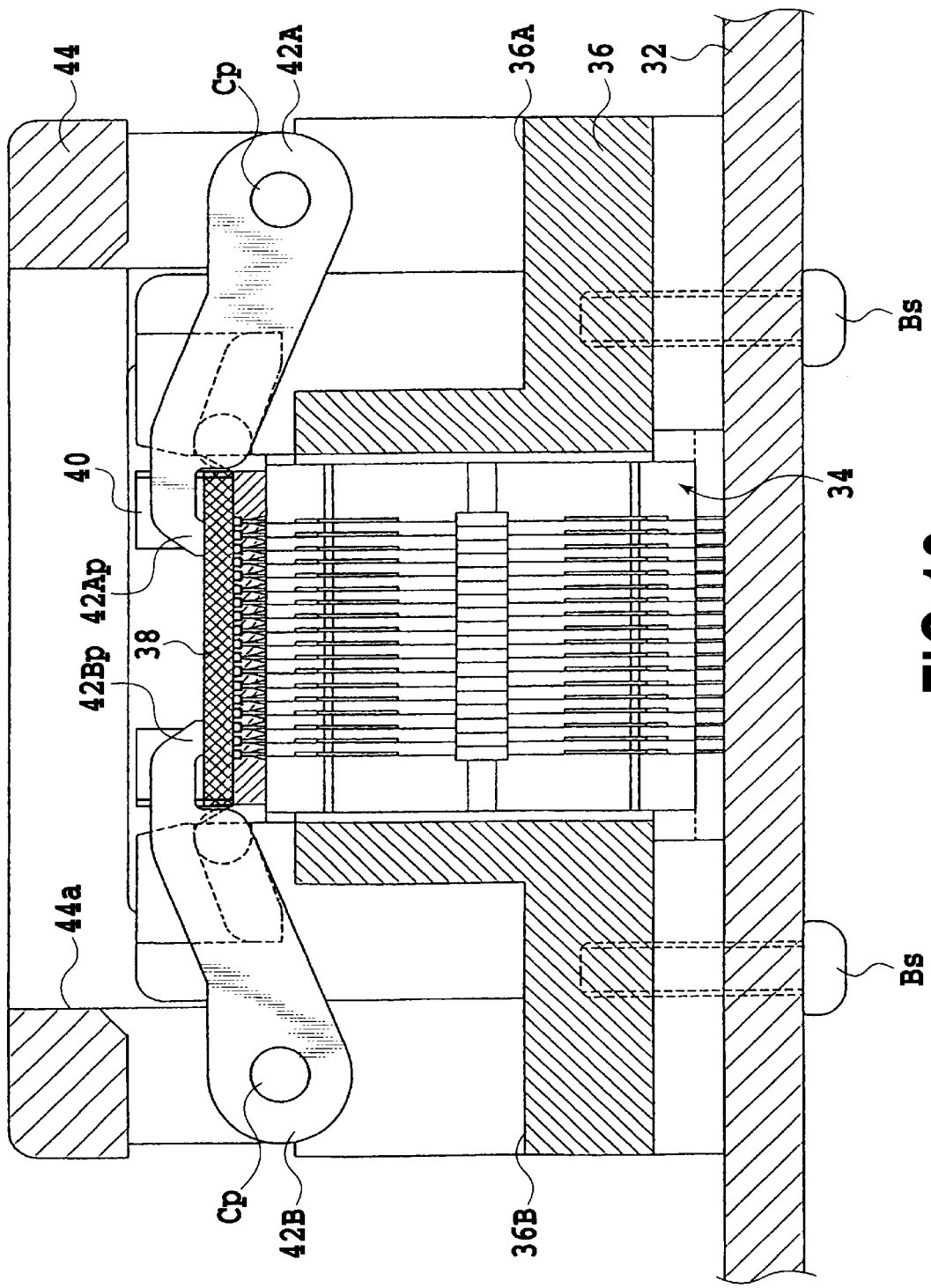
FIG. 13 is a sectional view for explaining the operation of the embodiment shown in FIG. 9.
Figure 14:
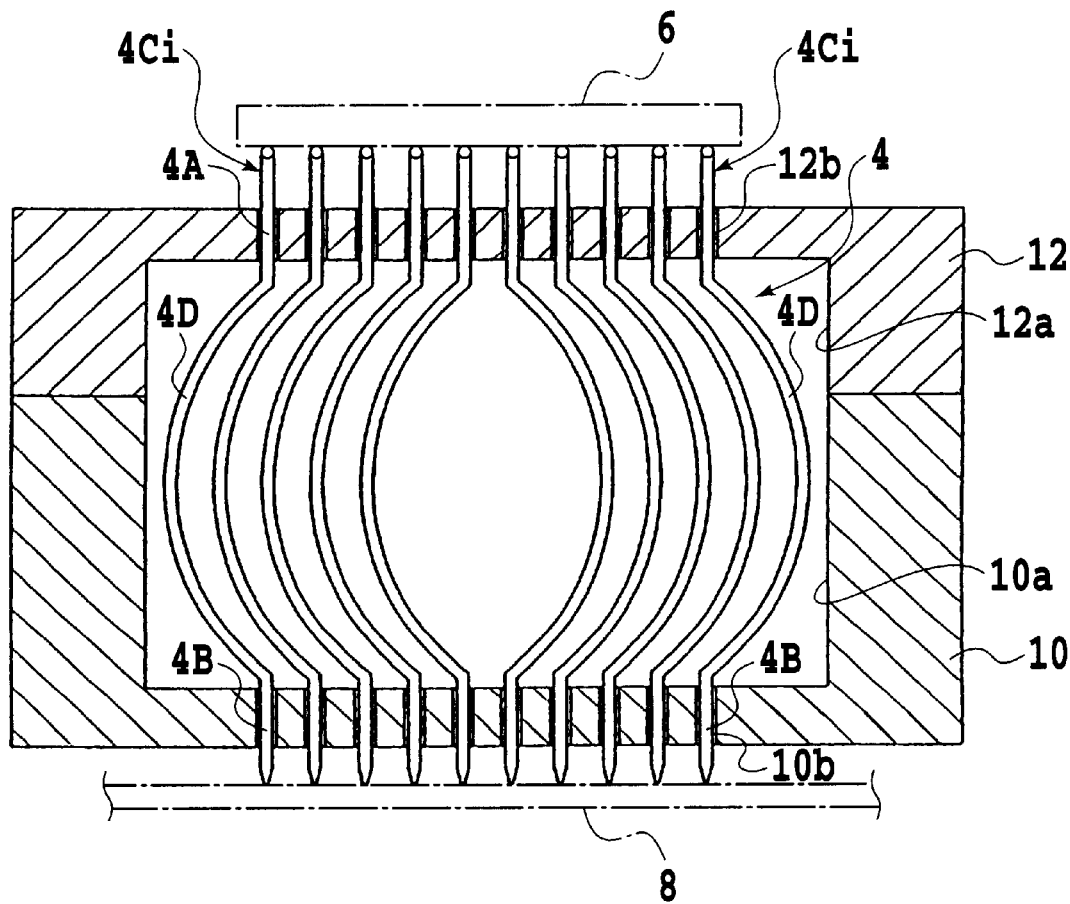
FIG. 14 is a sectional view for schematically showing an important point of the prior art contact pin module.
Figure 15:
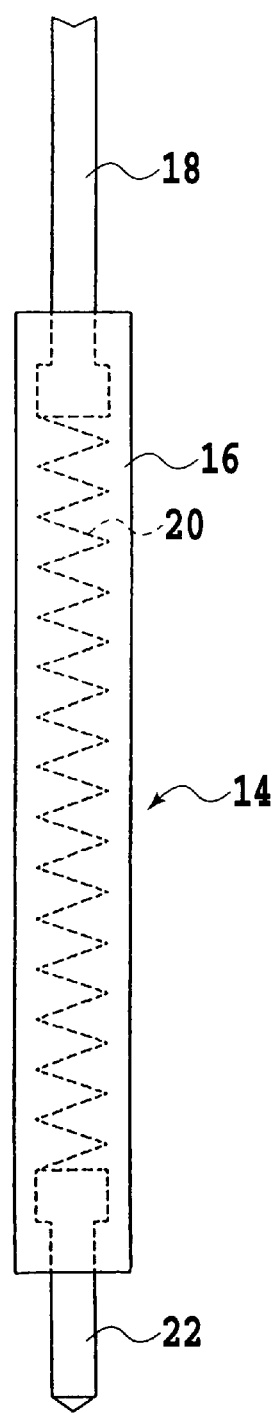
FIG. 15 is a view for schematically showing an the structure of another prior art contact pin.

Sequentially, when the front end of the work robot is moved upward while being in contact with the upper surface of the movable member 44, the movable member 44 is elevated from an open position to a test position by the bias of the coil spring 46 as shown in FIG. 13.

At this time, the pressing surfaces 42AP and 42BP of the pressing members 42A and 42B are made to rotate moveably approximately at the same timing to press the semiconductor element 38 toward the contact pin module 34. Thereby, the semiconductor element 38 is pressed by the pressing surfaces 42AP and 42BP of the pressing members 42A and 42B and thus uniformly pushed toward the planar part 40B at a predetermined pressure. Also, the terminal portions 60d of the contact pin module 34 is displaced to be in contact with the terminals of the semiconductor element 38 at a predetermined contacting force. At that time, the applying pressure is not transmitted to the terminal portions 62d of the contact pin module 34.

When the test signal is supplied to the input/output section of the printed circuit board 32 while the movable member 44 is maintained at the test position, the test signal is supplied to the semiconductor element 38 via the contact pin module 34. If the abnormality is detected in a circuit of the semiconductor element 38, an abnormality detection signal is supplied from the semiconductor element 38 through the input/output section to an external diagnostic device.

When the inspection of the semiconductor element 38 has completed, the front end of the arm of the work robot is brought into contact with the upper surface of the movable member 44 in the same manner as described above, for the purpose of taking out the semiconductor element 38 and, in place, mounting a new semiconductor element 38, and presses the movable member 44 downward against the bias of the coil spring 46. The tested semiconductor element 38 is removed from the alignment plate 40 by the conveying arm HA, and the semiconductor element 38 to be newly tested is mounted thereto as described above.

In this regard, while the number of the terminal portions 60d and 62d of the respective lead frames 54 are equal to each other in the above embodiment, the present invention is not limited thereto but the number of the contact pins may be suitably thinned, i.e. interlaced in the respective lead frames in accordance with the arrangement of the terminals of the semiconductor element 38.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A contact pin module comprising:

a first connecting portion having terminal portions which are aligned in a row in an identical plane, formed of an elastic conductor electrically connected to a plurality of connecting terminals, respectively, of an object to be tested and including electronic circuits thereinto;

a second connecting portion having terminal portions which are aligned in a row in an identical plane, formed of an elastic conductor consecutive to said first connecting portion and electrically connected to a plurality of electrodes, respectively, of a board connected to a signal input/output section for inputting and outputting a test signal for said object to be tested;

a supporting member disposed at an approximately intermediate position between said first and said second connecting portions and supporting said conductor so that a contacting force of said terminal portion of said first connecting portion to said connecting terminal and a contacting force of said terminal portion of said second connecting portion to said electrode are individually adjustable; and a holding member for holding a plurality of said first connecting portions, said second connecting portions and said supporting members in an overlaid manner in the direction orthogonal to the array of said terminal portions, wherein a spring constant of said first connecting portion and that of said second connecting portion are set such that a contacting force between said connecting terminal of said object and said terminal portion of said first connecting portion is different from a contacting force between said electrode of said board and said terminal portion of said second connecting portion.

2. A contact pin module as defined in claim 1, wherein said conductor in said first and said second connecting portions comprise curved portions consecutive to said terminals portions, respectively.

3. A contact pin module as defined in claim 1, wherein radii of curvature in said first and said second connecting portions are approximately equal to each other.

4. A testing device comprising:

a contact pin module as defined in claim 1;

an object under test accommodating member for positioning said contact pin module relative to a connecting portion of said contact pin module in a signal input/output portion and a connecting terminal of an object to be tested, said signal input/output section supplying a test signal to an object to be tested including an electronic circuit therein and delivering an output signal from the object to be tested via the contact pin module; and said object under test accommodating member for accommodating the contact pin module and said object to be tested therein; and a pressing mechanism for relatively pressing said object to be tested placed on said contact pin module relative to said contact pin module.

5. A contact pin module as defined in claim 1, wherein a whole length of said first connecting portion and a whole length of said second connecting portion are approximately equal to each other.

6. A contact pin module as defined in claim 1, wherein said object to be tested is a semiconductor device.

7. A contact pin module as defined in claim 1, wherein said supporting member is made of a resinous material and covers an intermediate position between said first and said second connecting portions.

8. A contact pin module as defined in claim 7, wherein said resinous material is an insulating material.

* * * * *